(12) United States Patent
Kasuya et al.

(10) Patent No.: US 8,072,359 B2
(45) Date of Patent: Dec. 6, 2011

(54) BINARY ARITHMETIC CODING DEVICE

(75) Inventors: Shigeru Kasuya, Yokohama (JP);
Norihiko Nagai, Yokohama (JP)

(73) Assignee: NTT Electronics Corporation (JP)

( * ) Notice: Subject to any disclaimer, the term of this patent is extended or adjusted under 35 U.S.C. 154(b) by 153 days.

(21) Appl. No.: 12/674,218

(22) PCT Filed: Aug. 20, 2008

(86) PCT No.: PCT/JP2008/064790
§ 371 (c)(1),
(2), (4) Date: Feb. 19, 2010

(87) PCT Pub. No.: WO2009/025281
PCT Pub. Date: Feb. 26, 2009

(65) Prior Publication Data
US 2011/0122964 A1 May 26, 2011

(30) Foreign Application Priority Data
Aug. 20, 2007 (JP) .................................. 2007-214068

(51) Int. Cl.
*H03M 7/00* (2006.01)

(52) U.S. Cl. .............. 341/107; 341/50; 341/51; 341/65; 341/67; 341/106; 375/240.02; 375/240.12; 375/240.14; 375/240.25; 382/100; 382/107; 382/247; 382/284

(58) Field of Classification Search .................... 341/50, 341/51, 65, 67, 106, 107; 375/240.02, 240.12, 375/240.14, 240.15, 240.25; 382/247, 100, 382/107, 284, 238
See application file for complete search history.

(56) References Cited

U.S. PATENT DOCUMENTS

| | | | | |
|---|---|---|---|---|
| 6,894,628 B2 * | 5/2005 | Marpe et al. | | 341/107 |
| 6,900,748 B2 * | 5/2005 | Marpe et al. | | 341/107 |
| 6,943,710 B2 * | 9/2005 | Marpe et al. | | 341/106 |
| 7,079,057 B2 * | 7/2006 | Kim et al. | | 341/107 |
| 7,095,344 B2 * | 8/2006 | Sekiguchi et al. | | 341/107 |
| 7,176,815 B1 | 2/2007 | Hung et al. | | |
| 7,251,371 B2 * | 7/2007 | Kobayashi et al. | | 382/239 |
| 7,379,608 B2 * | 5/2008 | Marpe et al. | | 382/247 |

(Continued)

FOREIGN PATENT DOCUMENTS

JP 2004-128619 A 4/2004

(Continued)

OTHER PUBLICATIONS

Shojania et al., "A High Performance CABAC Encoder", IEEE-Newcas Conference, The 3rd International, Quebec City, Canada, Jun. 19-22, 2005, pp. 104-107.

(Continued)

*Primary Examiner* — Linh Nguyen
(74) *Attorney, Agent, or Firm* — Kilpatrick Townsend & Stockton LLP (57) ABSTRACT

An object of the present invention is to provide a binary arithmetic coding device that allows real-time processing with a higher image quality. At a timing at which a ternary data string for a target bit is outputted, an updated coding range width and an updated range width of less probability are outputted. For that reason, while a binary conversion unit (32) and an f value retention processor (33) convert the ternary data string into a binary data string to output a coded bit, a binary arithmetic re-normalization unit (31) is allowed to perform a processing of binary arithmetic coding for the next bit.

7 Claims, 8 Drawing Sheets

U.S. PATENT DOCUMENTS

| | | | | |
|---|---|---|---|---|
| 7,443,318 | B2* | 10/2008 | Hung et al. | 341/51 |
| 7,522,076 | B1* | 4/2009 | Hsu et al. | 341/107 |
| 7,684,488 | B2* | 3/2010 | Marpe et al. | 375/240.16 |
| 7,777,654 | B2* | 8/2010 | Chang | 341/107 |
| 7,876,240 | B2* | 1/2011 | Le Lann et al. | 341/51 |
| 7,898,445 | B2* | 3/2011 | Otsuka | 341/107 |
| 2005/0001745 | A1 | 1/2005 | Sankaran | |

FOREIGN PATENT DOCUMENTS

| | | |
|---|---|---|
| JP | 2004-135252 A | 4/2004 |

OTHER PUBLICATIONS

Mo et al., "A High Throughout Binary Arithmetic Coding Engine for h.264/avc", Solid-State and Integrated Circuit Technology, 2006, Icsict 2006, 8th International Conference, IEEE, PI, Jan. 1, 2006, pp. 1914-1918.

Nunez et al., "High Performance Arithmetic Coding VLSI Macro for the H264 Video Compression Standard", 2005 Digest of Technical Papers, International Conference on Consumer Electronics, Jan. 8, 2005, pp. 287-288.

Jian-Long et al., "A Low Cost Context Adaptive Arithmetic Coder for H.264/MPEG-4 AVC Video Coding", 2007 IEEE International Conference on Acoustics, Speech and Signal Processing: Apr. 15-20, 2007, Honolulu, HI, pp. II-105.

Supplementary European Search Report, European Patent Application No. 08792561.6, mailed Nov. 24, 2010.

International Preliminary Report on Patentability for PCT Application No. PCT/JP2008/064790, mailed on Mar. 18, 2010.

Flordal et al., "Acclerating CABAC Encoding for Multi-standard Media with Configurability", Proceedings of the 20th International Parallel and Distributed Processing Symposium, Apr. 25-29, 2006.

Bin, et al., "A High Speed CABAC Algorithm Based on Probability Estimation Update", Proceeding of the Fourth International Conference on Image and Graphics, Aug. 22-24, 2007, pp. 195-199.

Advanced Video Coding for Generic Audiovisual Services ITU-T, May 2003, JT-H264.

International Search Report for PCT/JP2008/064790, mailed Sep. 16, 2008.

* cited by examiner

BINARY ARITHMETIC CODING DEVICE

CROSS REFERENCE TO RELATED APPLICATIONS

This application is a U.S. National Phase of PCT/JP2008/064790 filed on Aug. 20, 2008 which claims the benefit of Japanese Application No. 2007-214068 filed on Aug. 20, 2007, both of which are incorporated herein by reference.

TECHNICAL FIELD

The present invention relates to an entropy coding technique for H.246.

BACKGROUND ART

In recent years, as techniques to code video data acquired by a camera or the like, various techniques, such as DVC, MEPG2, and MPEG4, have been widely used in accordance with the uses of users.

Moreover, in addition to conventional analog broadcasting, digital terrestrial broadcasting which broadcasts digital images has been started recently. In order to record the digital images with a higher image quality, a technique with better coding efficiency has been demanded. In order to address these techniques, the H.264 specification, which is one of standards of a compression coding scheme in video data, is already standardized. Although H.264 requires a larger amount of computation for coding and decoding than MPEG2 or MPEG4 does, higher coding efficiency can be obtained with H.264.

Two kinds of techniques are standardized in H.264: one is a technique using adaptive variable length coding called CAVLC (Context-Adaptive Variable Length Coding); and the other is a technique using adaptive binary system coding called CABAC (Context-Adaptive Binary Arithmetic Coding). The characteristics of CAVLC using Huffman coding, which has low compressibility and a small amount of computation, are that CAVLC is suitable for real-time processing but has a poor image quality. On the other hand, CABAC using binary arithmetic coding has high compressibility and a large amount of computation. Accordingly, the characteristics of CABAC are that CABAC is not suitable for the real-time operation although having a higher image quality than that in the case where CAVLC is used.

In order to perform the real-time operation by use of conventional binary arithmetic coding, it is necessary to use CAVLC having lower compressibility than CABAC, or to increase the quantization step size and reduce an image quality when CABAC is to be used.

Nonpatent Document 1: "Advanced video coding for generic audiovisual services", ITU-T, May, 2003, JT-H264

DISCLOSURE OF THE INVENTION

An object of the present invention is to provide a binary arithmetic coding device that allows real-time processing with a high image quality.

A binary arithmetic coding device according to first aspect of the present invention is summarized in that the binary arithmetic coding device is configured to input binary data expressed in binary numbers, a symbol ratio which indicates probability of occurrence of an less probable symbol occurring less frequently in the binary data, and a more probable symbol which occurs more frequently in the binary data, the binary arithmetic coding device configured to code each bit of the binary data by updating an coding range width with which binary arithmetic coding is performed and a range width of less probability indicating how much the less probable symbol occurring less frequently occurs in the coding range width, the binary arithmetic coding device including: a binary arithmetic re-normalization unit configured to calculate a temporary coding range width and a temporary range width of less probability obtained by temporarily updating the coding range width and the range width of less probability on the basis of a determination result of whether or not a target bit to be coded coincides with the more probable symbol, generate a ternary data string of a plurality of bits arranged in output order, the plurality of bits being obtained by repeatedly performing, by a constant number of times, a bit output processing in which any one of the binary numbers and a ternary number of a uncertain value is outputted as a bit according to a result of comparison between the temporary range width of less probability and a predetermined proportion of a maximum coding range width determined by binary arithmetic coding and in which the temporary range width of less probability is further updated, and the bit output processing performed according to a result of comparison between the further updated temporary range width of less probability and a predetermined proportion to a maximum coding range width determined by the binary arithmetic coding, and output a first valid range value of the plurality of bits included in the ternary data string; a ternary data storing unit configured to store the ternary data string and the first valid range value; a binary conversion unit configured to read the ternary data string and the first valid range value from the ternary data storing unit, convert the ternary data string into a binary data string having any one of the binary numbers as a bit on the basis of a determination result of whether or not each bit of the ternary data string coincides with any one of the binary numbers, calculate a total number of bits that cannot be converted into the binary data string as a number of pieces of unprocessed data, and calculate a second valid range value of bits of the binary data string obtained by subtracting the number of pieces of the unprocessed data from the first valid range value; a binary data storing unit configured to store the binary data string, the second valid range value, and the number of pieces of the unprocessed data; and an f value retention processing unit configured to read the binary data string, the second valid range value, and the number of pieces of the unprocessed data from the binary data storing unit, output no coded bit string for the target bit, and add the number of pieces of the unprocessed data thus read to the number of pieces of the unprocessed data held in advance, when the second valid range value is zero, determine whether or not the number of pieces of the unprocessed data is held in advance when the second valid range value is more than zero, output an coded bit string in which an inverted value of an initial bit of the binary data string is inserted next to the initial bit by the number equivalent to the number of pieces of the unprocessed data held in advance, and overwrite the read number of pieces of the unprocessed data onto the number of pieces of the unprocessed data held in advance, when the number of pieces of the unprocessed data has been held; and output the binary data string as an coded bit string, and hold the number of pieces of the unprocessed data thus read, when the number of pieces of the unprocessed data has not been held.

In the present invention, at a timing at which the ternary data string for the target bit is outputted, the updated coding range width and the updated range width of less probability are outputted. Therefore, while the binary conversion unit and the f value retention processing unit convert the ternary data string into the binary data string to output the coded bit, the binary arithmetic re-normalization unit is allowed to perform processing of binary arithmetic coding for the next bit. In other words, because fewer clock cycles are needed for binary arithmetic coding, a binary arithmetic coding device that is allowed to perform real-time processing with a high image quality can be provided.

A binary arithmetic coding device according to second aspect of the present invention is summarized in that when the target bit coincides with the more probable symbol, the binary arithmetic re-normalization unit determines the range width of less probability as the temporary range width of less probability, and determines a value obtained by subtracting the symbol ratio from the coding range width as the temporary coding range width; and when the target bit does not coincide with the more probable symbol, the binary arithmetic re-normalization unit determines a value obtained by adding the value obtaining by subtracting the symbol ratio from the range width of less probability to the coding range width as the temporary range width of less probability, and determines the symbol ratio as the temporary coding range width.

A binary arithmetic coding device according to third aspect of the present invention is summarized in that in the bit output processing, when the temporary range width of less probability is less than ¼ of a maximum coding range width determined by the binary arithmetic coding, one of the binary numbers is outputted as a bit, and the temporary range width of less probability is shifted to the left by 1 bit; when the temporary range width of less probability is not less than ¼ of the maximum coding range width determined by the binary arithmetic coding, the temporary range width of less probability is compared with ½ of the maximum coding range width determined by binary arithmetic coding; when the temporary range width of less probability is not less than ½ of the maximum coding range width determined by the binary arithmetic coding, the other of the binary numbers is outputted as a bit, and a value obtained by subtracting ½ of the maximum value of the coding range width determined by the binary arithmetic coding from the temporary range width of less probability is shifted to the left by 1 bit; and when the temporary range width of less probability is less than ½ of the maximum coding range width determined by the binary arithmetic coding, the uncertain value is outputted as a bit, and a value obtained by subtracting ¼ of the maximum value of the coding range width determined by the binary arithmetic coding from the temporary range width of less probability is shifted to the left by 1 bit.

A binary arithmetic coding device according to fourth aspect of the present invention is summarized in that when the constant number of times is n times, the binary arithmetic re-normalization unit performs first comparison of a value obtained by shifting the temporary coding range width to the left by n−1 bits with ¼ of the maximum coding range width determined by binary arithmetic coding, and when the value obtained by shifting the temporary coding range width to the left by the n−1 bit is less than ¼ of the maximum coding range width determined by binary arithmetic coding, the binary arithmetic re-normalization unit outputs the first valid range value indicating that a bit range from an initial bit to an n-th bit of the ternary data string are valid; when the value obtained by shifting the temporary coding range width to the left by n−1 bits is not less than ¼ of the maximum coding range width determined by binary arithmetic coding, the binary arithmetic re-normalization unit performs second comparison of a value obtained by further shifting to the left by 1 bit the value obtained by shifting the temporary coding range width to the left in the previous comparison, with ¼ of the maximum coding range width determined by binary arithmetic coding, and when the value further shifted to the left by 1 bit is less than ¼ of the maximum coding range width determined by the binary arithmetic coding, the binary arithmetic re-normalization unit performs an output processing to output, from an initial bit of the ternary data string, a bit range with 1 bit less than bits in the bit range obtained by the previous output processing as the first valid range value; and when the value further shifted to the left by 1 bit is not less than ¼ of the maximum coding range width determined by the binary arithmetic coding, the binary arithmetic re-normalization unit repeats the second comparison and the output processing until the number of left shifting the temporary coding range width becomes zero, when the temporary coding range width is less than ¼ of the maximum range width determined by binary arithmetic coding, the binary arithmetic re-normalization unit outputs the first valid range value indicating that the initial bit of the ternary data string is valid, and when the temporary coding range width is not less than ¼ of the maximum range width determined by the binary arithmetic coding, the binary arithmetic re-normalization unit outputs the first valid range value indicating that all the bits of the ternary data string are invalid A binary arithmetic coding device according to fifth aspect of the present invention is summarized in that the binary arithmetic re-normalization unit outputs the first valid range value by the output processing, outputs as an updated coding range width a value obtained by shifting the temporary coding range width to the left by a number of times of the left shift in the previous comparison; outputs the temporary range width of less probability updated by an n-th bit output processing as an updated range width of less probability, where n is equivalent to the number of left shifting in the previous comparison; and uses the updated coding range width and the updated range width of less probability for coding of a bit to be coded subsequent to the target bit.

A binary arithmetic coding device according to sixth aspect of the present invention is summarized in that the binary conversion unit performs a conversion processing in which the binary conversion unit performs first comparison of whether or not an s-th bit of bits of the ternary data string coincides with one of the binary numbers; when the s-th bit coincides with one of the binary numbers, the binary conversion unit performs first determination of whether or not the (s−1)-th bit coincides with one of the binary numbers; when the (s−1)-th bit coincides with one of the binary numbers, the binary conversion unit determines the s-th bit as the s-th bit of the binary data string; and when the (s−1)-th bit coincides with neither of the binary numbers, the binary conversion unit determines an inverted value of the s-th bit as the s-th bit of the binary data string; and when the s-th bit coincides with neither of the binary numbers, the binary conversion unit performs second comparison of whether or not the next bit used in the previous comparison coincides with one of the binary numbers; when the next bit coincides with one of the binary numbers, the binary conversion unit performs the first determination; when the (s−1)-th bit coincides with one of the binary numbers, the binary conversion unit determines the next bit as the s-th bit of the binary data string; and when the (s−1)-th bit coincides with neither of the binary numbers, the binary conversion unit determines an inverted value of the next bit as the s-th bit of the binary data string; and when the next bit coincides with neither of the binary numbers, the binary conversion unit repeats the second comparison, the first determination, and the conversion processing until a last bit of the ternary data string; and when the last bit coincides with neither of the binary numbers, the binary conversion unit determines the s-th bit of the binary data string as invalid and does not output the s-th bit.

A binary arithmetic coding device according to seventh aspect of the present invention is summarized in that the maximum coding range width determined by the binary arithmetic coding is a maximum value of an coding range width specified by H.264.

The present invention is able to provide a binary arithmetic coding device that allows real-time processing with a high image quality.

DESCRIPTION OF EMBODIMENT

Hereinafter, an embodiment of the present invention will be described using the drawings.
<Description of Configuration of Binary Arithmetic Coding Device>

Figure 1:
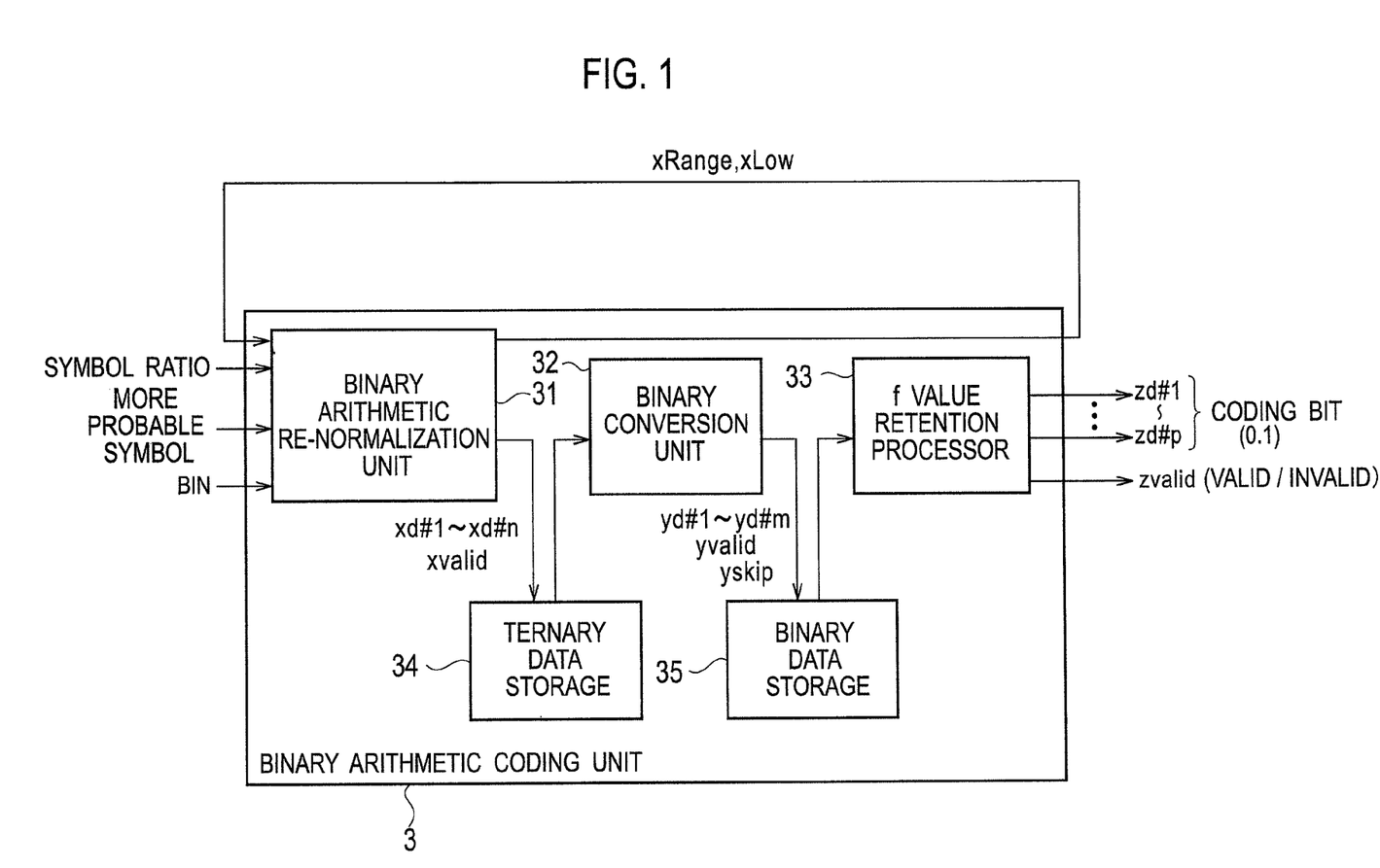
FIG. 1 is a block diagram showing a configuration of a binary arithmetic coding device according to an embodiment.

FIG. 1 is a block diagram showing a configuration of a binary arithmetic coding device according to the present embodiment. The binary arithmetic coding device according to the present embodiment inputs binary data, a symbol ratio, and a more probable symbol, the binary data obtained by binarizing multi value data by a binarizing unit at a front stage not shown to an appropriate length on the basis of a predetermined constant regulation (hereinafter, referred to as "BIN"), the symbol ratio showing probability of occurrence of an less probable symbol which occurs less frequently in the BIN, the more probable symbol occurring more frequently in the BIN. Then, the binary arithmetic coding device repeats a processing to update an coding range width with which the arithmetic coding device performs binary arithmetic coding (hereinafter, referred to as "xRange") and a range width of less probability showing how much a less probable symbol, which occurs less frequently, occurs in this xRange (hereinafter, referred to as "xLow"). In this manner, the binary arithmetic coding device codes each bit that forms the BIN.

This binary arithmetic coding device includes a binary arithmetic coding unit 3 having a binary arithmetic re-normalization unit 31, a binary conversion unit 32, an f value retention processor 33, a ternary data storage 34 that stores a ternary data string outputted from the binary arithmetic re-normalization unit 31, and a binary data storage 35 that stores a binary data string converted by the binary conversion unit 32.
<Description of Configuration of Binary Arithmetic Re-Normalization Unit>

Figure 2:
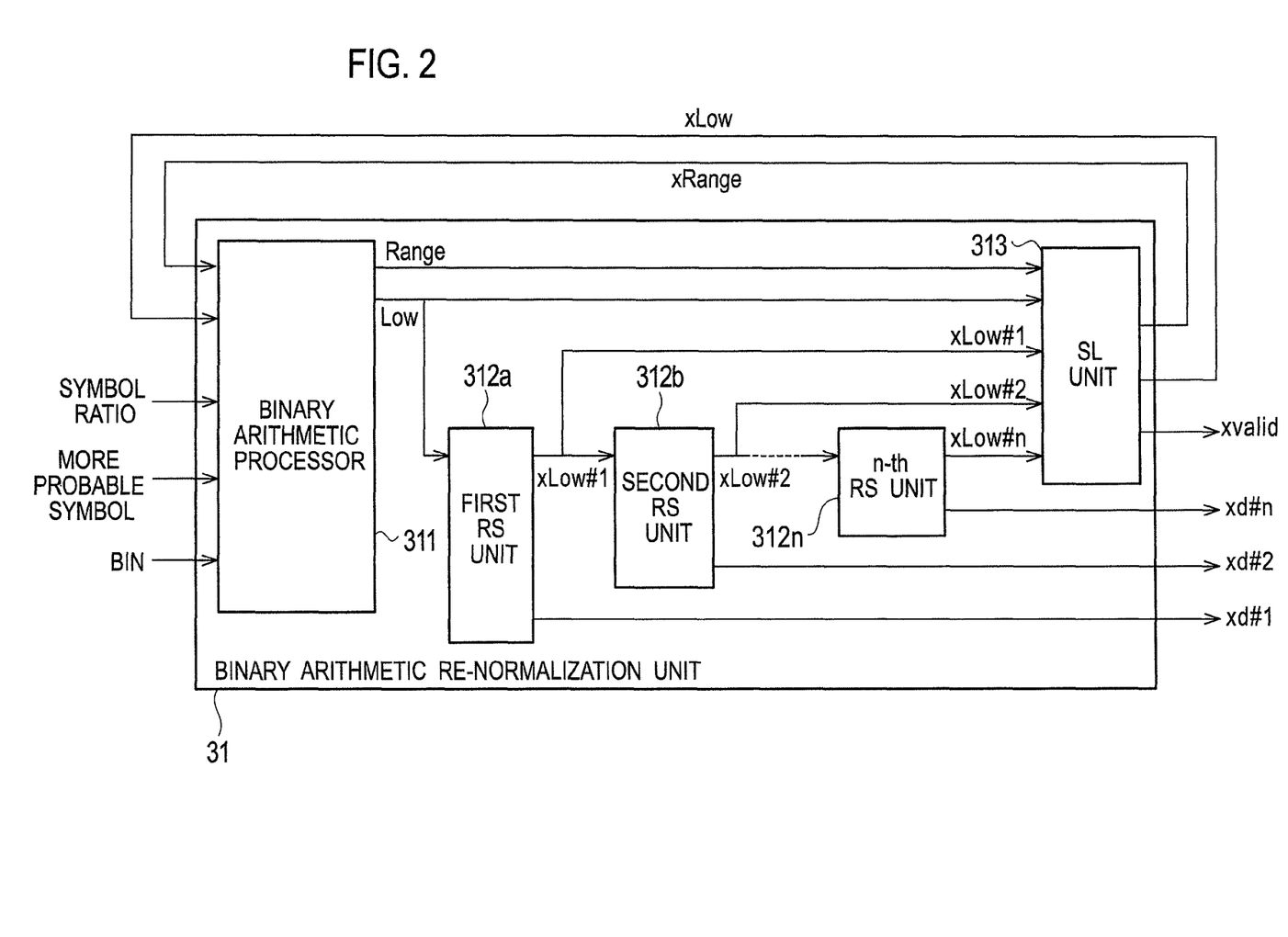
FIG. 2 is a block diagram showing a configuration of a binary arithmetic re-normalization unit.

FIG. 2 is a block diagram showing a configuration of the binary arithmetic re-normalization unit 31. The binary arithmetic re-normalization unit 31 includes a binary arithmetic processor 311, first to n-th RS (Renormalize Subblock) units 312a to 312n, and an SL (Selector) unit 313. The binary arithmetic processor 311 receives xRange and xLow updated at the time of binary arithmetic coding for a bit prior to a target bit to be coded, and receives BIN, a symbol ratio of the BIN, and a more probable symbol of the BIN. Then, the binary arithmetic processor 311 outputs a temporary coding range width (hereinafter, referred to as "Range") and a temporary range width of less probability (hereinafter, referred to as "Low"), the Range obtained by temporarily updating the xRange, the Low obtained by temporarily updating the xLow.

The first RS unit 312a receives the Low outputted from the binary arithmetic processor 311, and outputs the xLow#1 and the ternary data xd#1. One RS unit that configures the first to n-th RS units 312a to 312n performs a processing corresponding to a single processing in which a loop B is separated from a loop A shown in FIG. 12 of a comparative example described later. Accordingly, in the case of H.264, the same processing is attained by providing eight RS units at most. The subsequent second to n-th RS units receive the xLow#1 to xLow#n−1 outputted from the first to (n−1)-th RS units at front stages, and output the xLow#2 to xLow#n and the ternary data xd#2 to xd#n. Hereinafter, the Low and xLow#1 to xLow#n−1 that the first to n-th RS units 312a to 312n receives are referred to as Low'.

The SL unit 313 receives the Range and Low outputted from the binary arithmetic processor 311 as well as the xLow#1 to xLow#n outputted from the first to n-th RS units 312a to 312n. Then, the SL unit 313 outputs updated xRange, updated xLow, and a valid range value that indicates a valid range of the ternary data xd#1 to xd#n (hereinafter, referred to as "xvalid").
<Description of Processing Flow in Binary Arithmetic Processor>

Figure 3:
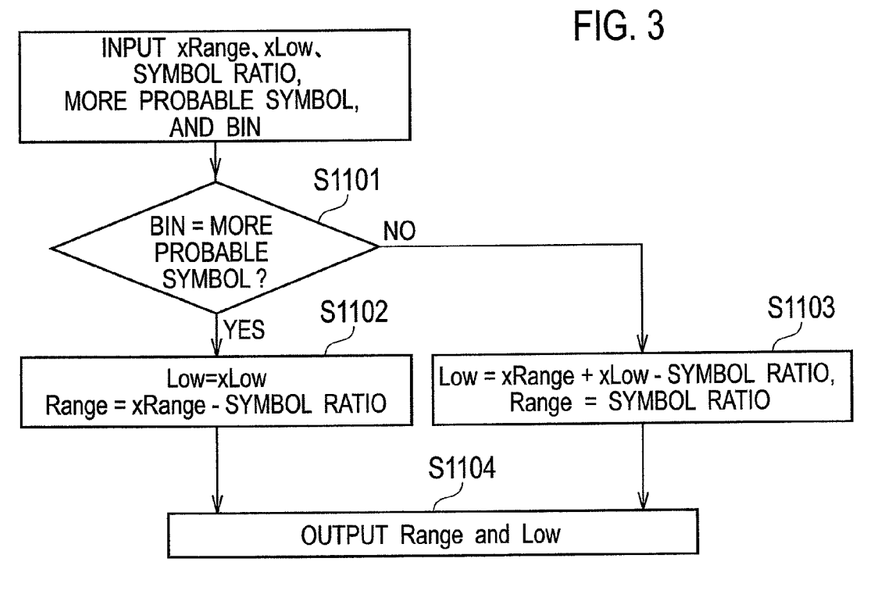
FIG. 3 is a flow chart showing a processing flow in a binary arithmetic processor.

FIG. 3 is a flow chart showing a processing flow in the binary arithmetic processor 311. First, the binary arithmetic processor 311 determines whether or not the target bit to be coded in the BIN that the binary arithmetic processor 311 has received coincides with the more probable symbol (Step S1101). When the target bit of the received BIN is determined as being the more probable symbol in Step S1101, a processing of Low=xLow, Range=xRange−symbol ratio is performed (Step S1102). On the other hand, when the target bit of the received BIN is determined as not being the more probable symbol in Step S1101, a processing of Low=xRange+xLow−symbol ratio, Range=symbol ratio is performed (Step S1103). Finally, the Range and Low processed in Step S1102 or Step S1103 are outputted (Step S1104).
<Description of Processing Flow in First to N-Th RS Units>

Figure 4:
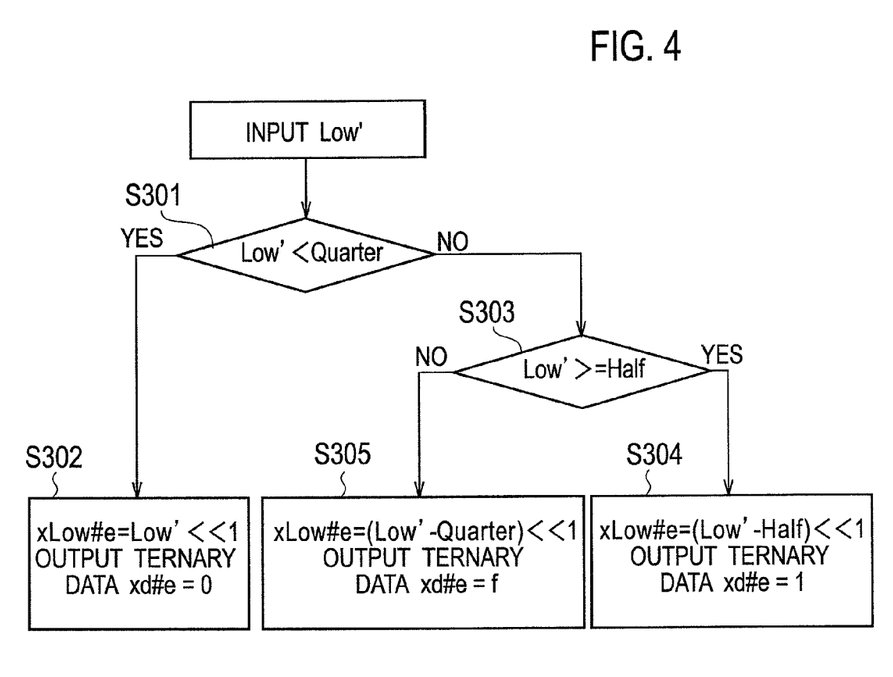
FIG. 4 is a flow chart showing a processing flow in first to n-th RS units.

FIG. 4 is a flow chart showing a processing flow in the first to n-th RS units 312a to 312n. Because the processing flow for each RS unit is the same, a description will be made of a processing flow of a case where the e-th RS unit at an e stage receives Low'.

The e-th RS unit compares the received Low' with Quarter that indicates a value of ¼ of the maximum value of the Range (Step S301). At Step S301, when the Low' is less than the Quarter, the e-th RS unit outputs a value obtained by left shifting the value of the received Low' by 1 bit, as the xLow#e, as well as outputs the ternary data xd#e=0 (Step S302). At Step S301, when the Low' is equal to the Quarter or more, the e-th RS unit compares the Low' with Half that indicates a value of ½ of the maximum value of the Range (Step S303). At Step S303, when the Low' is equal to the Half or more, the e-th RS unit shifts a value to the left by one bit, the value obtained by subtracting the Half from the Low'. Then the e-th RS unit outputs the left-shifted value as the xLow#e as well as outputs ternary data xd#e=1 (Step S304). At Step S303, when the Low' is less than the Half, the e-th RS unit shifts a value to the left by one bit, the value obtained by subtracting the Quarter from the Low'. Then the e-th RS unit outputs the left-shifted value as the xLow#e as well as outputs the ternary data xd#e=f (Step S305). A value f outputted as the ternary data in Step S305 denotes an uncertain value f indicating that coding is impossible.

Then, the (e+1)-th RS unit located at a subsequent stage receives the xLow#e outputted from the e-th RS unit at the front stage. The (e+1)-th RS unit outputs a Low value xLow#e+1 and the ternary data xd#e+1 in the same manner as in the processing mentioned above.

The ternary data xd#1 to xd#n outputted from each RS unit are inputted into the binary conversion unit 32 through the ternary data storage 34 as a ternary data string arranged in an order the ternary data xd#1 to xd#n are outputted. The xLow#1 to xLow#n are respectively inputted into the RS unit located at the subsequent stage and the SL unit 313.

<Description of Processing Flow in SL Unit>

Figure 5:
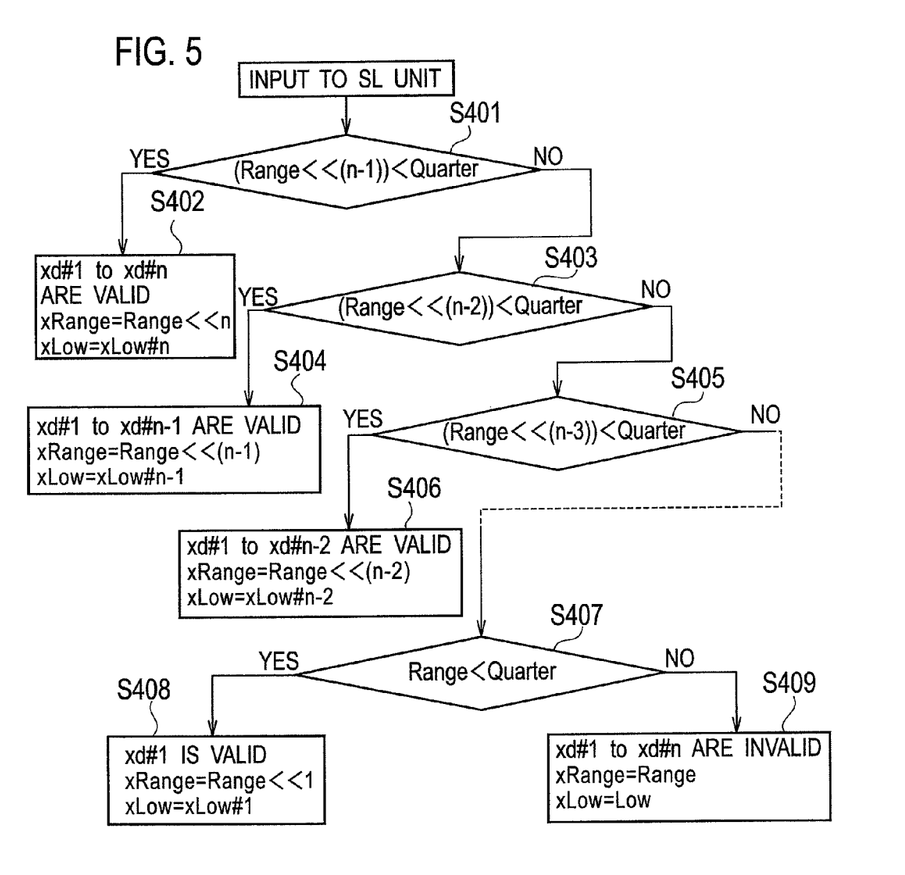
FIG. 5 is a flow chart showing a processing flow in an SL unit.

FIG. 5 is a flow chart showing a processing flow in the SL unit 313. First, the SL unit 313 compares the Quarter with a first shift value obtained by left shifting the Range by n−1 bits (Step S401). At Step S401, when the first shift value is less than the Quarter, the SL unit 313 outputs the xvalid that indicates that all of the ternary data xd#1 to xd#n are valid, outputs the value obtained by left shifting the Range by an n bit as the xRange, and outputs the xLow#n as the xLow (Step S402). When the first shift value is equal to the Quarter or more in Step S401, the SL unit 313 compares the Quarter with a second shift value obtained by left shifting the Range by an n−2 bit (Step S403). At Step S403, when the second shift value is less than the Quarter, the SL unit 313 outputs the xvalid that indicates that all of the ternary data xd#1 to xd#n−1 are valid, outputs a value obtained by left shifting the Range by n−1 bits as the xRange, and outputs the xLow#n−1 as the xLow (Step S404). When the second shift value is equal to the Quarter or more in Step S403, the SL unit 313 compares the Quarter with a third shift value obtained by left shifting the Range by an n−3 bit (Step S405). At Step S405, when the third shift value is less than the Quarter, the SL unit 313 outputs the xvalid that indicates that all of the ternary data xd#1 to xd#n−2 is valid, outputs a value obtained by left shifting the Range by an n−2 bit as the xRange, and outputs the xLow#n−2 as the xLow (Step S406). Hereinafter, the SL unit 313 sequentially shifts the Range to the left by 1 bit, compares the Quarter with the left shifted Ranges, and outputs the xvalid, the xRange, and the xLow according to the comparison results.

Finally, the SL unit 313 compares the Range with the Quarter (Step S407). At Step S407, when the Range is less than the Quarter, the SL unit 313 outputs the xvalid that indicates that only the ternary data xd#1 is valid, outputs a value obtained by left shifting the Range by 1 bit as the xRange, and outputs the xLow#1 as the xLow (Step S408). When the Range is equal to the Quarter or more in Step S407, the SL unit 313 outputs the xvalid that indicates that all of the ternary data xd#1 to xd#n is invalid, outputs the Range as the xRange, and outputs the Low as the xLow (Step S409).

The updated xRange and the updated xLow which are outputted from the SL unit 313 are again fed back to the binary arithmetic re-normalization unit 31, and are used for binary arithmetic coding processing to the next bit. The xvalid is inputted into the binary conversion unit 32 through the ternary data storage 34 together with the ternary data string outputted from each RS unit.

<Description of Configuration of Binary Conversion Unit>

Figure 6:
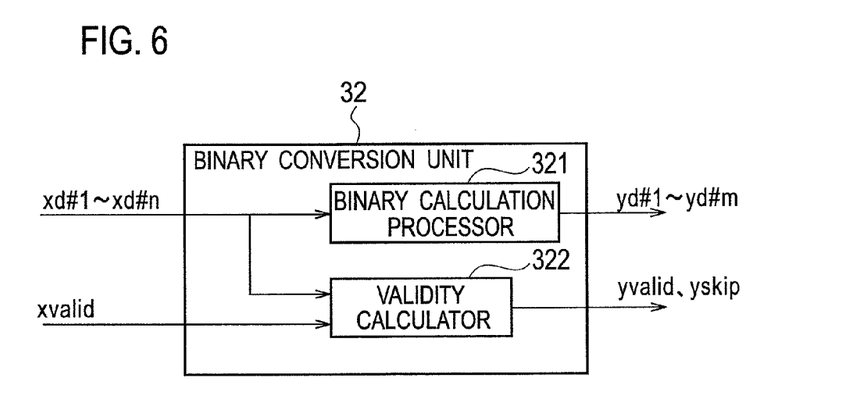
FIG. 6 is a block diagram showing a configuration of a binary conversion unit.

FIG. 6 is a block diagram showing a configuration of the binary conversion unit 32. The binary conversion unit 32 includes a binary calculation processor 321 and a validity calculator 322. The binary conversion unit 32 receives n pieces of the ternary data xd#1 to xd#n outputted from the binary arithmetic re-normalization unit 31 through the ternary data storage 34, and the xvalid that indicates the valid range of the ternary data xd#1 to xd#n. Then, the binary conversion unit 32 outputs m pieces of binary data yd#1 to yd#m, a valid range value that indicates a valid range of the binary data yd#1 to yd#m (hereinafter, referred to as "yvalid"), and the number of pieces of unprocessed data (hereinafter, referred to as "yskip") obtained by counting the number of uncertain values f that cannot be coded.

The binary calculation processor 321 receives the ternary data xd#1 to xd#n as a ternary data string outputted from the binary arithmetic re-normalization unit 31. Then, the binary calculation processor 321 determines whether or not each piece of the received ternary data is a determined value of "0" or "1" or a uncertain value of f, converts the ternary data into the binary data, and outputs the m pieces of the binary data yd#1 to yd#m thus converted as a binary data string.

The validity calculator 322 receives the ternary data xd#1 to xd#n and the xvalid outputted from the binary arithmetic re-normalization unit 31. Then, the validity calculator 322 outputs the yskip and the yvalid, the yskip obtained by counting the number of uncertain values f continued from the last of the received ternary data xd#1 to xd#n, the yvalid indicating a valid range of the binary data calculated by subtracting the yskip from the xvalid.

<Description of Processing Flow in Binary Calculation Processor>

Figure 7:
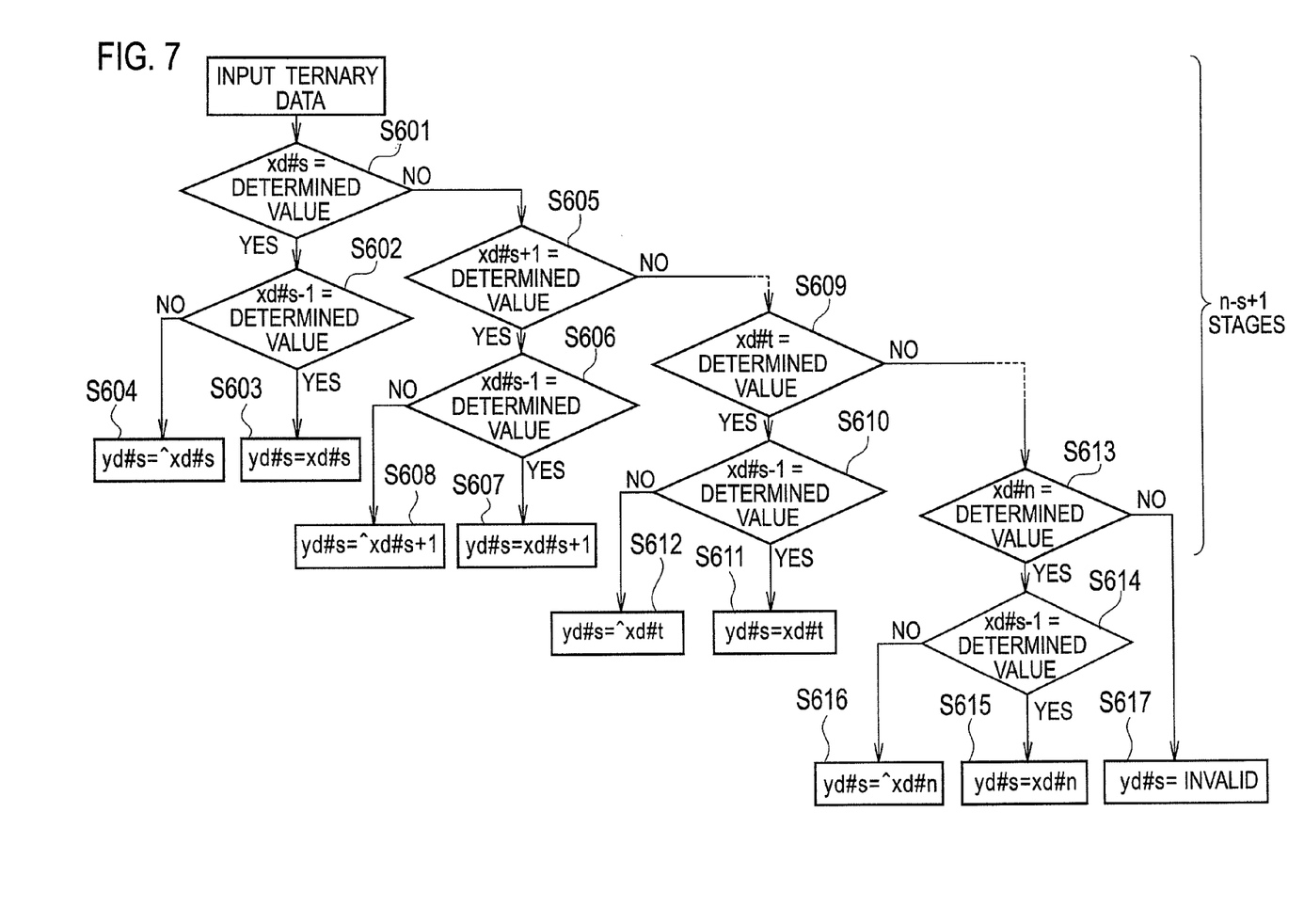
FIG. 7 is a flow chart showing a processing flow in a binary calculation processor.

FIG. 7 is a flow chart showing a processing flow in the binary calculation processor 321. A description will be given of a flow to calculate s-th binary data when n pieces of the ternary data xd#1 to xd#n are inputted into the binary conversion unit 32.

The binary calculation processor 321 determines whether or not an inputted ternary data xd#s is a determined value (Step S601). When the ternary data xd#s is determined as being the determined value in Step S601, the binary calculation processor 321 determines whether or not ternary data xd#s−1, which is the immediately before the ternary data xd#s, is a determined value (Step S602). When s=1 in Step S601, there is no previous ternary data. Accordingly, the binary calculation processor 321 processes the ternary data xd#s−1 as a determined value in this case. When the ternary data xd#s−1 is determined as being the determined value in Step S602, the binary calculation processor 321 outputs s-th ternary data xd#s as s-th binary data yd#s (Step S603). When the ternary data xd#s−1 is the determined as being uncertain value in Step S602, the binary calculation processor 321 outputs, as the s-th binary data yd#s, an inverted value ^xd#s of the s-th ternary data xd#s (Step S604). Note that "^" designates an inverted value.

When the ternary data xd#s is determined as being the uncertain value in Step S601, the binary calculation processor 321 determines whether or not the following ternary data xd#s+1 is the determined value (Step S605). When the ternary data xd#s+1 is determined as being the determined value in Step S605, the binary calculation processor 321 determines whether or not the (s−1)-th ternary data xd#s−1 is the determined values (Step S606). When the ternary data xd#s−1 is determined as being the determined value in Step S606, the binary calculation processor 321 outputs the (s+1)-th ternary data xd#s+1 as the s-th binary data yd#s (Step S607). When the ternary data xd#s−1 is determined as being the uncertain value in Step S606, the binary calculation processor 321 outputs an inverted value ^xd#s+1 of the (s+1)-th ternary data xd#s+1 as the s-th binary data yd#s (Step S608).

Hereafter, in this manner, the binary calculation processor 321 determines whether or not the t-th ternary data xd#t is the determined value (Step S609). When the ternary data xd#t is determined as being the determined value in Step S609, the binary calculation processor 321 determines whether or not the (s−1)-th ternary data xd#s−1 is the determined value (Step S610). When the ternary data xd#s−1 is determined as being the determined value in Step S610, the binary calculation processor 321 outputs the t-th ternary data xd#t as the s-th binary data yd#s (Step S611). When the ternary data xd#s−1 is determined as being the uncertain value in Step S610, the binary calculation processor 321 outputs an inverted value ^xd#t of the t-th ternary data xd#t as the s-th binary data yd#s (Step S612).

When all the ternary data including the (n−1)-th ternary data xd#n−1 is determined as being the uncertain value, the binary calculation processor 321 determines whether or not the n-th ternary data xd#n is the determined value (Step S613). When the ternary data xd#n is determined as being the determined value in Step S613, the binary calculation processor 321 determines whether or not the (s−1)-th ternary data xd#s−1 is the determined value (Step S614). When the ternary data xd#s−1 is determined as being the determined value in Step S614, the binary calculation processor 321 outputs the n-th ternary data xd#n as the s-th binary data yd#s (Step S615). When the ternary data xd#s−1 is determined as being the uncertain value in Step S614, the binary calculation processor 321 outputs an inverted value ^xd#n of the n-th ternary data xd#n as the s-th binary data yd#s (Step S616).

When the ternary data xd#n is determined as being the uncertain value in Step S613, all the ternary data xd#s to xd#n is the uncertain value, and therefore, the binary calculation processor 321 determines the s-th bit as invalid and outputs nothing without converting any of the ternary data xd#s to xd#n into the binary data (Step S617). In this case, recognition is enabled by the yvalid described later.

The binary data yd#1 to yd#m outputted from the binary calculation processor 321 is inputted into the f value retention processor 33 through the binary data storage 35 as a binary data string.

Figure 8:
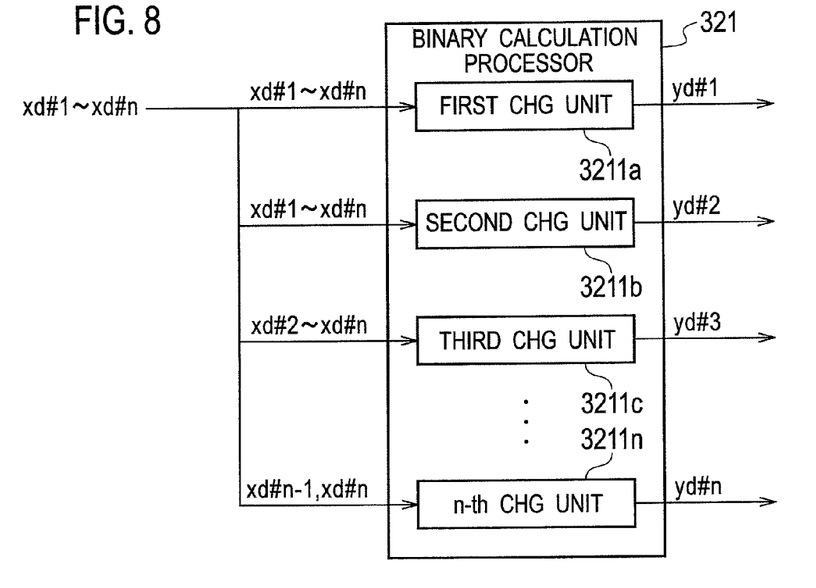
FIG. 8 is a block diagram showing a configuration of the binary calculation processor.

The above-mentioned processing is possible as parallel calculation processing if CHG (Charge) units corresponding in number to the pieces of the ternary data are provided as shown in FIG. 8, the CHG units each determining the binary data yd#z of 1 bit is provided in the binary calculation processor 321.

<Description of Processing Flow in Validity Calculator>

As described previously, the validity calculator 322 outputs the yskip and yvalid, the yskip obtained by counting the number of uncertain values f that cannot be coded, the yvalid indicating the valid range of the binary data yd#1 to yd#m and being obtained by subtracting the yskip from the xvalid indicating the valid range of the ternary data xd#1 to xd#n.

The yskip and yvalid outputted from the validity calculator 322 are inputted into the f value retention processor 33 through the binary data storage 35.

<Description of Specific Example Binary Conversion Unit Converts>

Figure 9:
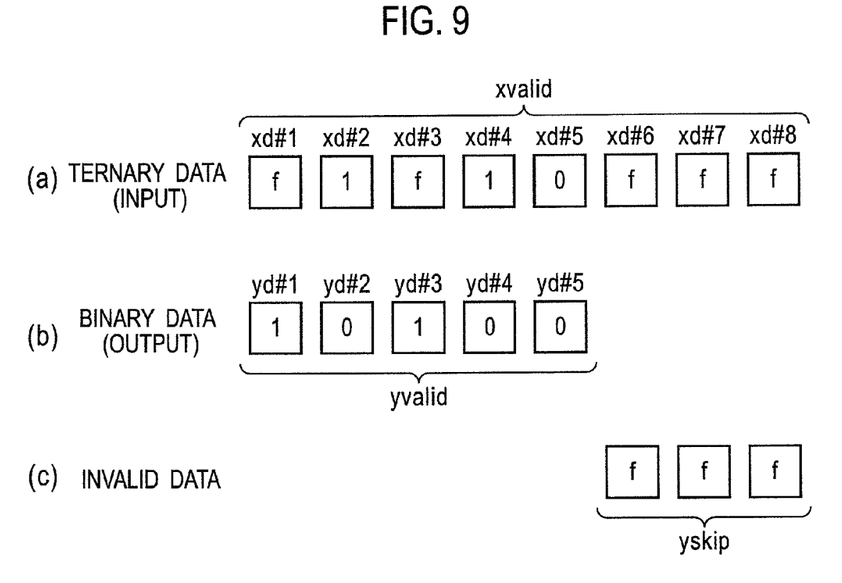
FIG. 9 is a diagram showing a specific example in which ternary data outputted from the binary arithmetic re-normalization unit is converted into binary data by the binary conversion unit.

Here, the processing flow shown in FIG. 7 will be described more specifically. FIG. 9 is a diagram showing a specific example in which the ternary data xd#1 to xd#8 outputted from the binary arithmetic re-normalization unit 31 is converted into the binary data yd#1 to yd#5 by the binary conversion unit 32. FIG. 9(a) is a diagram showing 8-bit ternary data xd#1 to xd#8 outputted from the binary arithmetic re-normalization unit 31. FIG. 9(b) is a diagram showing after this 8-bit ternary data xd#1 to xd#8 is converted into the binary data yd#1 to yd#5. FIG. 9(c) is a diagram showing invalid data which is not converted into the binary data.

When having received the ternary data xd#1 to xd#8 shown in FIG. 9(a), the binary calculation processor 321 determines whether or not the xd#1 is the determined value in Step S601. Since the xd#1 is the uncertain value f, the binary calculation processor 321 determines whether or not the xd#2 is the determined value in Step S605. Since the xd#2 is the determined value "1," the binary calculation processor 321 performs a processing in Step S606. Step S606 is a processing to calculate xd#1−1, but here, the received xd#1 is the first bit. Accordingly, it is considered thin Step S606 is all true, and the value of xd#2 "1" is outputted as the binary data yd#1.

Similarly, when the second binary data yd#2 is to be determined, it is determined as Yes in Step S601, and determined as No in Step S602. Accordingly, an inverted value of the xd#2 "0" is outputted as the yd#2. Hereinafter, the binary data as shown in FIG. 9(b) is outputted to the yd#5. Since the ternary data xd#6 to xd#8 is the uncertain value f, the ternary data xd#6 to xd#8 is determined as invalid by the processing shown in FIG. 7, and fails to be converted into the binary data as shown in FIG. 9(c). In this case, the validity calculator 322 outputs the number obtained by counting the number of the ternary data xd#6 to xd#8 as the yskip.

The validity calculator 322 outputs the yskip, and outputs the number obtained by subtracting the yskip from the xvalid as yvalid.

<Description of Configuration of f Value Retention Processor>

The f value retention processor 33 receives m pieces of binary data yd#1 to yd#m, the yvalid, and the yskip through the binary data storage 35, the binary data yd#1 to yd#m being as a binary data string outputted from the binary conversion part 32, the yvalid indicating the valid range of the binary data yd#1 to yd#m, the yskip indicating the number of pieces of unprocessed data obtained by counting the number of uncertain values f that cannot be coded. Then, the f value retention processor 33 outputs coded bits zd#1 to zd#p, and a valid range value that indicates a valid range of a coded bit string (hereinafter, referred to as "zvalid").

<Description of Processing Flow in f Value Retention Processor>

Figure 10:
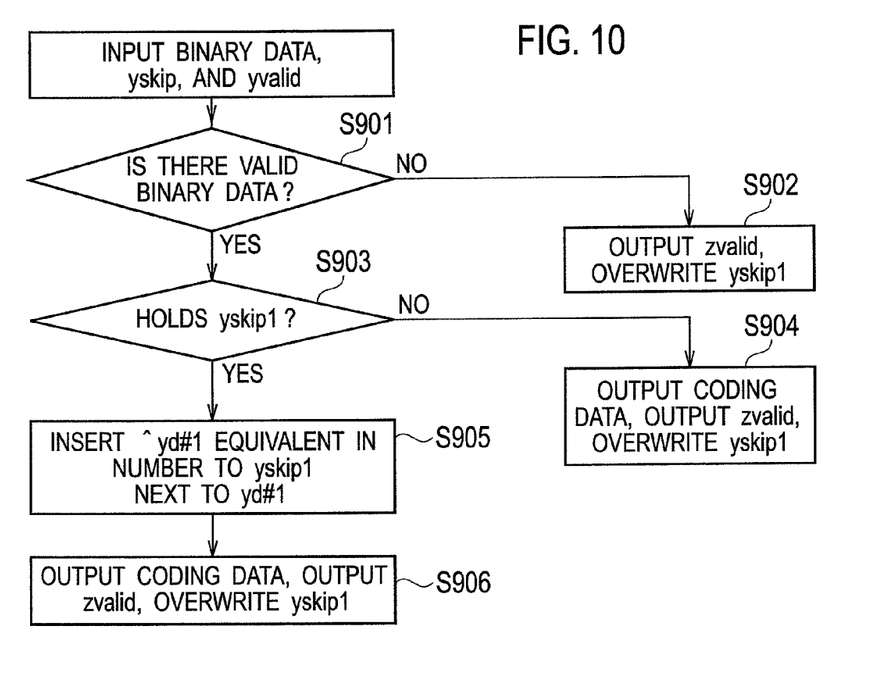
FIG. 10 is a flow chart showing a processing flow in an f value retention processor.

FIG. 10 is a flow chart showing a processing flow in the f value retention processor 33. When having received the binary data yd#1 to yd#m, the yskip, and the yvalid, the f value retention processor 33 checks if there is any valid binary data on the basis of the value of the yvalid (Step S901). When it is determined in Step S901 that no valid binary data exists, the f value retention processor 33 determines that there is no output of the coded bit string, and outputs zvalid=0. The f value retention processor 33 then overwrites, as the yskip1, a value obtained by adding the received yskip onto the previous yskip (hereinafter, referred to as "yskip1") that the f value retention processor 33 has held before input of the received yskip and holds the yskip1 (Step S902). When it is determined that the valid binary data exists in Step S901, the f value retention processor 33 checks if the f value retention processor 33 has held the yskip1 (Step S903). When it is determined that the f value retention processor 33 does not hold the yskip1 in Step S903, the f value retention processor 33 outputs the binary data yd#1 to yd#m as the coded bits zd#1 to zd#m, and outputs the yvalid as the zvalid. Then, the f value retention processor 33 overwrites the yskip onto the yskip1, and holds the yskip1 (Step S904). The yskip1 thus held is used when the f value retention processor 33 receives the next binary data. When it is determined that the f value retention processor 33 has held the yskip1 in Step S903, the f value retention processor 33 inserts inverted values of yd#1 (˜yd#1) equivalent in number to the yskip1 that the f value retention processor 33 has held, next to the initial bit yd#1 (Step S905). After Step S905, the f value retention processor 33 outputs the coded bit zd#1 to zd#p obtained by adding the yd#2 to yd#m, and outputs a value obtained by adding the yskip1 to the yvalid as the zvalid. Then, the f value retention processor 33 overwrites the yskip onto the yskip1, and holds the yskip1 (Step S906). For example, when the binary data string as shown in FIG. 9(b) is inputted, and the yskip1=3, three inverted values "0" of 1 are inserted into the bit next to the yd#1, and "10000100" is obtained.

<Description of Specific Processing Flow in Binary Arithmetic Coding Unit>

A description will be given of a specific processing flow in the binary arithmetic coding unit 3 described using FIG. 1 to FIG. 10. Here, the Range and Low outputted from the binary arithmetic processor 311 are set as Range=1 and Low=5, the maximum value of the Range=1024, Quarter=256, and Half=512.

The first RS unit 312a shown in FIG. 2 receives Low=5, the processing proceeds from Step S301 to Step S302 shown in FIG. 4, and the first RS unit 312a outputs xLow#1=10 and xd#1=0. The second RS unit 312b receives xLow#1=10 and outputs xLow#2=20 and xd#2=0. Hereinafter, the third RS unit outputs xLow#3=40 and xd#3=0, the fourth RS unit outputs xLow#4=80 and xd#4=0, the fifth RS unit outputs xLow#5=160 and xd#5=0, and the sixth RS unit outputs xLow#6=320 and xd#6=0. In the seventh RS unit, the processing proceeds from Step S301 to Step S303, and then to Step S305, and the seventh RS unit outputs xLow#7=128 and xd#7=f. The eighth RS unit outputs xLow#8=256 and xd#8=0 and the ternary data xd#1 to xd#8 becomes 000000f0. Then, the xLow#e outputted from each RS unit is inputted into the SL unit 313. At Step S401 shown in FIG. 5, the SL unit 313 compares the Quarter with the first shift value obtained by left shifting the Range by 7 bits (=8−1). In this case, the first shift value is 128 and is less than the Quarter. Accordingly, the processing proceeds to Step S402, all of the ternary data xd#1 to xd#8 is determined as valid, and xRange=256 and xLow=256 are outputted.

The ternary data xd#1 to xd#8 and the xvalid that indicates that all of the ternary data xd#1 to xd#8 is valid are inputted into the binary conversion unit 32 through the ternary data storage 34. The xd#1 is the determined value and the initial value. Accordingly, the processing proceeds from Step S601 to Step S602, and then to Step S603 shown in FIG. 7, and yd#1=0, yd#2=0, yd#3=0, yd#4=0, yd#5=0, and yd#6=0 are obtained subsequently. Because the xd#7 is f, the processing proceeds from Step S601 to Step S605, and then to Step S606 to Step S607, and yd#7=0 is obtained. Because the xd#8 is 0, the processing proceeds from Step S601 to Step S602. Because the xd#7 is f, the processing then proceeds to Step S604, and yd#8=1 is obtained. Accordingly, the binary data yd#1 to yd#8 is 00000001. Moreover, the binary conversion unit 32 outputs a value of 0 (zero) as the yskip that indicates the number of uncertain values of the binary data string and a value of 8 as the yvalid that indicates the valid range of the binary data string, the yvalid obtained by subtracting the yskip from the xvalid.

The binary data yd#1 to yd#8 and the yvalid, and the yskip, which are outputted from the binary conversion unit 32, are inputted into the f value retention processor 33 through the binary data storage 35. Because there is valid binary data, the processing proceeds from Step S901 to Step S903 shown in FIG. 10. Since the f value retention processor 33 does not hold the yskip1, the processing proceeds to Step S904. The f value retention processor 33 outputs the binary data yd#1 to yd#8 as the coded bits as it is, and overwrites 0 (zero) as the yskip, since the yskip is 0 (zero).

Through the above-mentioned processing, the coded bits "00000001," xRange=256, and xLow=256 are outputted.

DESCRIPTION OF COMPARATIVE EXAMPLE

Next, a comparative example of the present embodiment will be described.

Figure 11:
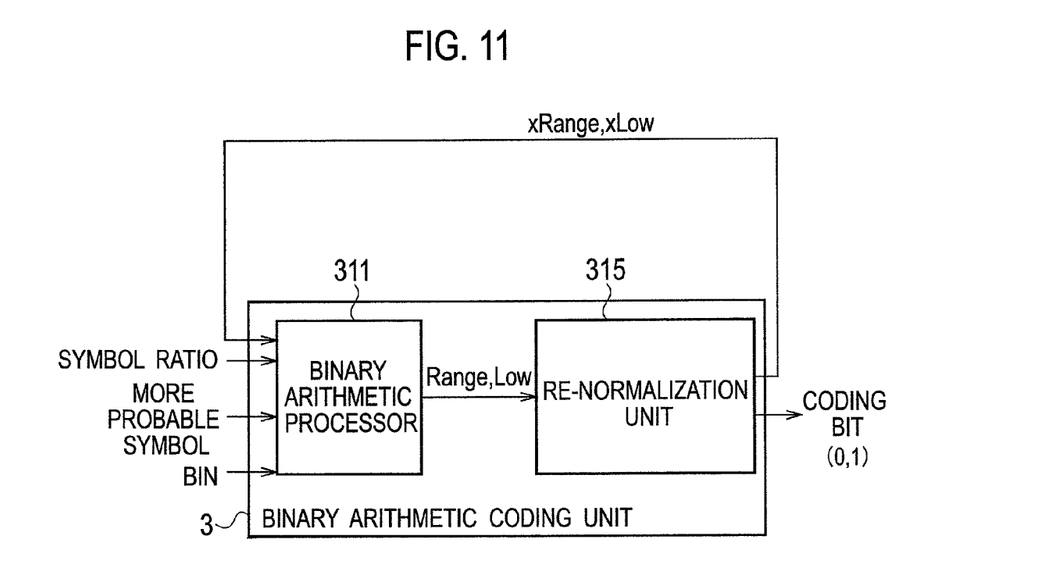
FIG. 11 is a block diagram showing a configuration of a binary arithmetic coding device according to a comparative example.

FIG. 11 is a block diagram showing a configuration of a binary arithmetic coding device according to a comparative example in which the CABAC is used. The binary arithmetic coding device of the comparative example receives binary data (hereinafter, referred to as "BIN"), a symbol ratio, and a more probable symbol, the BIN obtained by binarizing multi value data by a binarizing unit at a front stage not shown into an appropriate length on the basis of a predetermined constant regulation, the symbol ratio showing probability of occurrence of a less probable symbol which occurs less frequently in the BIN, the more probable symbol occurring more frequently in the BIN. Then, the binary arithmetic coding device of the comparative example repeats a processing to update a coding range width (hereinafter, referred to as "xRange") with which the binary arithmetic coding device of the comparative example performs binary arithmetic coding, and a range width of less probability showing how much a less probable symbol, which occurs less frequently, occurs in this xRange (hereinafter, referred to as "xLow"). In this manner, the binary arithmetic coding device of the comparative example codes each bit that forms the BIN.

The binary arithmetic coding device of the comparative example includes a binary arithmetic coding unit 3 having a binary arithmetic processor 311 and a re-normalization unit 315. The binary arithmetic processor 311 receives the xRange and xLow updated at the time of binary arithmetic coding of a bit prior to a target bit to be coded as well as receives the BIN, the symbol ratio of this BIN, and the more probable symbol of the BIN. Then, the binary arithmetic processor 311 outputs a temporary coding range width obtained by temporarily updating the xRange (hereinafter, referred to as "Range") and a temporary range width of less probability obtained by temporarily updating the xLow (hereinafter, referred to as "Low").

The re-normalization unit 315 receives the Range and Low outputted from the binary arithmetic processor 311. The re-normalization unit 315 updates the range widths of the Range and of the Low reduced by the processing of the binary arithmetic processor 311 to enlarge the range widths, thereby performing coding with accuracy. The re-normalization unit 315 outputs a coded bit obtained by a processing shown in FIG. 12 and FIG. 13 described later, updates the Range and the Low, and outputs the updated xRange and the updated xLow. The outputted xRange and xLow thus updated are used for a binary arithmetic coding processing of the next bit.

Subsequently, a description will be given of a processing flow of the binary arithmetic coding device of the comparative example. Because the processing in the binary arithmetic processor 311 of the comparative example is the same as the processing of the present embodiment shown in FIG. 3, the redundant description thereof will be omitted here.

Figure 12:
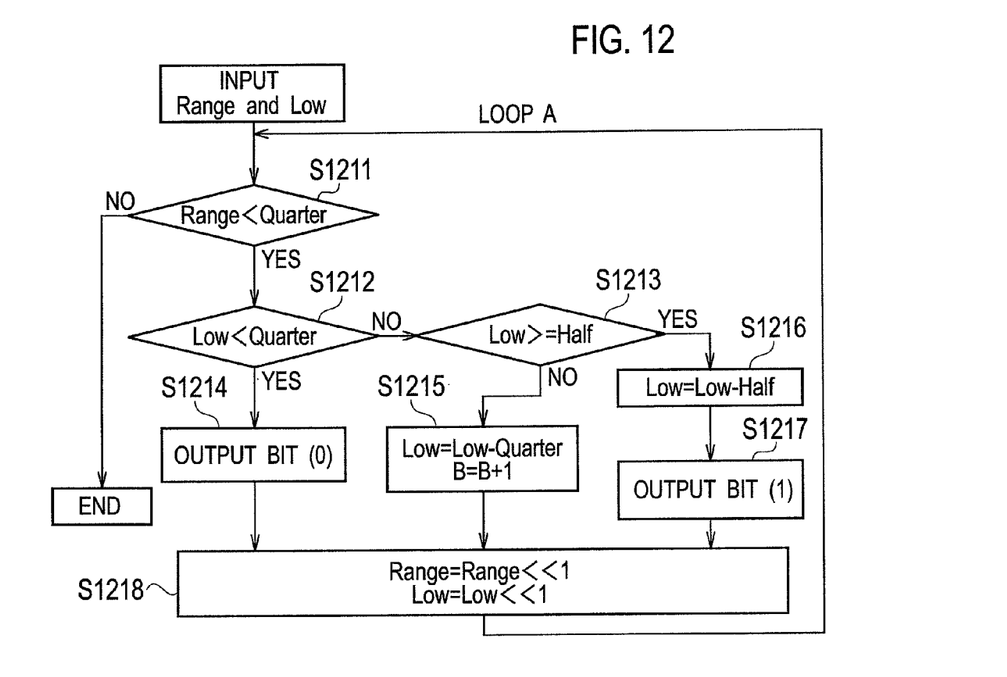
FIG. 12 is a flow chart showing a processing flow in a re-normalization unit according to the comparative example.

Next, a description will be given of a processing flow in the re-normalization unit 315. FIG. 12 is a flow chart showing a processing flow in the re-normalization unit 315. First, the re-normalization unit 315 receives the Range and Low outputted from the binary arithmetic processor 311. The re-normalization unit 315 compares the Range with the Quarter that indicates a value of ¼ of the maximum value of the Range (Step S1211). When the Range is equal to the Quarter or more in Step S1211, the re-normalization unit 315 completes re-normalizing processing. On the other hand, when the Range is less than the Quarter, the re-normalization unit 315 compares the Low with the Quarter (Step S1212). When the Low is equal to the Quarter or more in Step S1212, the re-normalization unit 315 compares the Low with the Half that indicates a value of a half of the maximum value of the Range (Step S1213). When the Low is less than the Quarter in Step S1212, the re-normalization unit 315 outputs a bit of "0" (Step S1214). A specific flow of a bit output in Step S1214 or Step S1217 described later will be described later. When the Low is less than the Half in Step S1213, the re-normalization unit 315 overwrites a value of Low−Quarter onto the Low, and increments a uncertain value B showing a state where an output value cannot be determined at the time of the re-normalizing processing (Step S1215). When the Low is equal to the Half or more in Step S1213, the re-normalization unit 315 overwrites a value of Low−Half onto the Low (Step S1216). After overwriting the Low in Step S1216, the re-normalization unit 315 outputs a bit of "1" (Step S1217). Then, after the bit output in Step S1214 or Step S1217, or after the increment processing in Step S1215, the re-normalization unit 315 shifts the values of the Range and the Low to the left by 1 bit, respectively, i.e., doubles the values of the Range and the Low (Step S1218). Then, the re-normalization unit 315 returns to Step S1211, and repeats the processing of a loop A of Step S1211 to Step S1218 until the Range becomes equal to the Quarter or more. When the Range is equal to the Quarter or more in Step S1211, the re-normalization unit 315 outputs the Range and the Low at that point of time as the xRange and the xLow.

Figure 13:
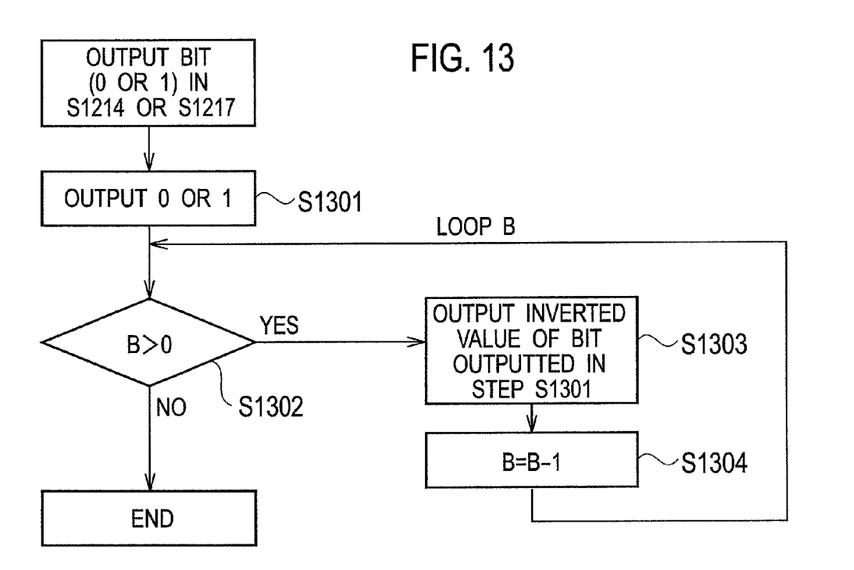
FIG. 13 is a flow chart showing a processing flow of a bit output according to the comparative example.

Here, the processing of the bit output in Step S1214 and Step S1217 will be described. FIG. 13 is a flow chart showing a processing flow of the bit output. In the bit output processing, the re-normalization unit 315 first outputs a coded bit "0" in the case of Step S1214, and first outputs a coded bit "1" in the case of Step S1217 (Step S1301). The re-normalization unit 315 compares the uncertain value B with 0 (zero) after outputting the coded bit (Step S1302). When the uncertain value B is more than 0 (zero) in Step S1302, the re-normalization unit 315 outputs an inverted value of the coded bit outputted in Step S1301 (Step S1303). After outputting an inverted value, the re-normalization unit 315 decrements the uncertain value B (Step S1304). After the decrement, the re-normalization unit 315 returns to Step S1302, and repeats the processing of a loop B from Step S1302 to Step S1304 until the uncertain value B becomes 0 (zero). When the uncertain value B is equal to 0 (zero) or less in Step S1302, the re-normalization unit 315 completes the processing of the loop B, and performs the processing in Step S1218, which is the processing of the loop A shown in FIG. 12.

Here, in the case of H.264, the maximum value of the Range is set to 1024 (tenth power of=2) as described in Non-patent Document 1. Therefore, the Quarter is 256 and the Half is 512. Suppose that the Range is the minimum value of 1. In this case, the value of the Range becomes equal to the Quarter by eight loop processings (eighth power of=2) since the value of the Range is doubled each time when the processing of Step S1218 is performed. Therefore, 8 processings of the loop A are needed at most.

Subsequently, along with the processing flows shown in FIG. 12 and FIG. 13, the coded bits outputted from the re-normalization unit 315 are calculated. Here, Range=1, Low=5, a maximum value of Range=1024, Quarter=256, Half=512, and an uncertain value B=0 (zero). When the Range and the Low are inputted into the re-normalization unit 315, the Range is compared with the Quarter in Step S1211. Because the Range is less than the Quarter, the processing proceeds to Step S1212. The Low is compared with the Quarter in Step S1212. Because the Low is less than the Quarter, the processing proceeds to Step S1214. A bit of "0" is outputted in Step S1214 (Step S1301). Because the uncertain value B is 0 (zero), the processing proceeds to Step S1218. At Step S1218, the Range and the Low are shifted to the left by 1 bit so that Range=2 and Low=10. The processing returns to Step S1211 by the processing of the loop A. Then, the processing proceeds from Step S1211 to Step S1212, and then to Step S1214, a bit of "0" is outputted so that Range=4 and Low=20 in Step S1218. Subsequently, the processing also returns to Step S1211 by the processing of the loop A. At Step S1214, a bit of "0" is outputted and the Range and the Low are shifted to the left by 1 bit in Step S1218.

When the bit output becomes "000000" and Range=64 and Low=320, the processing proceeds from Step S1211 to Step S1212, to Step S1213, and then to Step S1215. At Step S1215, Low=64 (=320−256) and the uncertain value B=1. The processing proceeds to Step S1218, Range=128 and Low=128. Then, the processing returns to Step S1211. Subsequently, the processing proceeds from Step S1211 to Step S1212, and then to Step S1214, and a bit of "0" is outputted in Step S1214 (Step S1301). At Step S1302, the uncertain value B is more than zero (zero). Accordingly, an inverted bit "1" of the bit "0" outputted in Step S1301 is outputted in Step S1303, and the uncertain value B is decremented in Step S1304. The processing returns to Step S1302 by the processing of the loop B. Because the uncertain value B is 0 (zero), the processing proceeds to Step S1218. Range=256 and Low=256 in Step S1218, and the processing returns to Step S1211 by the processing of the loop A. At Step S1211, because the Range is equal to the Quarter or more, the re-normalizing process is completed.

According to the above-mentioned processing, the coded bit outputted from the re-normalization unit 315 is "00000001," xRange=256, and xLow=256.

As mentioned above, the Range and Low outputted from the binary arithmetic processor of the comparative example change according to the BIN, the symbol ratio, and the more probable symbol to be inputted, and the number of times the re-normalization unit performs the loop processing depends on the changed Range and Low. For this reason, the timing at which the xRange and the xLow are outputted from the binary arithmetic coding unit is not always the same in the previous binary arithmetic coding processing and the subsequent binary arithmetic coding processing. Specifically, when more loop processings are repeated those in the previous binary arithmetic coding processing, the output timing of the xRange and the xLow is delayed so that the coding processing of the next BIN is delayed.

In other words, the binary arithmetic coding device of the comparative example requires longer processing time until the xRange and the xLow are outputted, and changes the number of times of the loop processing according to the BIN and the like to be inputted. Accordingly, it is difficult for the binary arithmetic coding device of the comparative example to determine the number of times of the loop processing uniformly, and thus to achieve real-time processing.

Description of Effect of the Present Embodiment

On the other hand, the binary arithmetic re-normalization unit 31 of the binary arithmetic coding device according to the present embodiment performs the processing shown in FIG. 3, and subsequently performs the processing corresponding to the processing in which the processing of the loop B shown in FIG. 13 is separated from the processing of the loop A shown in FIG. 12. Thereby, the binary arithmetic re-normalization unit 31 outputs the updated xRange and the updated xLow. The binary conversion unit 32 and the f value retention processor 33 according to the present embodiment determine the coded bit by performing the processing corresponding to the processing of the loop B shown in FIG. 13.

In the case of the re-normalizing process of the comparative example shown in FIG. 12 and FIG. 13, either one of the processing to output "0" and perform the processing of the loop B, the processing to increment the uncertain value B, and the processing to output "1" and perform the processing of the loop B is performed according to the size of the Low. After either of these processings is completed, the values of the Range and the Low are shifted to the left by 1 bit, and the processing returns to Step S1211. For this reason, longer processing time is needed to output the update values of the Range and the Low.

According to the present embodiment, before the coded bit is determined, the update values of the Range and the Low are determined, and the updated xRange and xLow are fed back. This enables pipeline processing in the binary arithmetic coding processing.

In other words, in the present embodiment, the processing in which the processing of the loop B is separated from the processing of the loop A is serially processed by the maximum number of times of the loop A, and the processed result is held in the form of ternarized data. Along with this processing, the update values of the xRange and the xLow are determined. The use of the updated xRange and the updated xLow for coding the next bit allows the pipeline processing.

In response to the processed result of the ternarized data above, the binary conversion unit 32 and the f value retention processor 33 according to the present embodiment perform the processing in which the loop B is substantially unlooped. Thereby, the coded bit can be determined.

In the case of the binary arithmetic coding device of the comparative example, the clock cycle required for re-normalizing 1 macro block of a predetermined image was 19,200 cycles. However, in the case of the binary arithmetic coding device in the present embodiment, the clock cycle was 3,200 cycles. Thereby, the present embodiment allows significant reduction of the time needed for the re-normalizing processing, thereby achieving a real-time operation with a higher image quality.

Finally, the binary arithmetic coding device described in the present embodiment is formed of a computer, and each processing is executed by a program. Moreover, for example, each processing is recorded on a recording medium such as CDs and FDs as a program, and this recording medium is incorporated into the computer; the program recorded on a recording medium is downloaded to the computer through a communication line; or the program is installed from a recording medium and the computer is operated by the program. Thereby, the functions mentioned above can be processed. The program can be more widely distributed by using such a recording medium.

According to the present embodiment, the updated coding range width and the updated range width of less probability are outputted at the timing at which a ternary data string for the target bit is outputted. Accordingly, while the binary conversion unit 32 and the f value retention processor 33 convert the ternary data string into the binary data string and output the coded bit, the binary arithmetic re-normalization unit 31 is allowed to perform the processing of binary arithmetic coding for the next bit. In other words, the binary arithmetic coding device that allows real-time processing with a higher image quality can be provided because the binary arithmetic coding device requires fewer clock cycles for the binary arithmetic coding.

We claim:

1. A binary arithmetic coding device configured to input binary data expressed in binary numbers, a symbol ratio which indicates probability of occurrence of an less probable symbol occurring less frequently in the binary data, and a more probable symbol which occurs more frequently in the binary data, the binary arithmetic coding device configured to code each bit of the binary data by updating an coding range width with which binary arithmetic coding is performed and a range width of less probability indicating how much the less probable symbol occurring less frequently occurs in the coding range width, the binary arithmetic coding device comprising:

a binary arithmetic re-normalization unit configured to
calculate a temporary coding range width and a temporary range width of less probability obtained by temporarily updating the coding range width and the range width of less probability on the basis of a determination result of whether or not a target bit to be coded coincides with the more probable symbol,
generate a ternary data string of a plurality of bits arranged in output order, the plurality of bits being obtained by repeatedly performing, by a constant number of times, a bit output processing in which any one of the binary numbers and a ternary number of a uncertain value is outputted as a bit according to a result of comparison between the temporary range width of less probability and a predetermined proportion of a maximum coding range width determined by binary arithmetic coding and in which the temporary range width of less probability is further updated, and the bit output processing performed according to a result of comparison between the further updated temporary range width of less probability and a predetermined proportion to a maximum coding range width determined by the binary arithmetic coding, and
output a first valid range value of the plurality of bits included in the ternary data string;

a ternary data storing unit configured to store the ternary data string and the first valid range value;

a binary conversion unit configured to
- read the ternary data string and the first valid range value from the ternary data storing unit,
- convert the ternary data string into a binary data string having any one of the binary numbers as a bit on the basis of a determination result of whether or not each bit of the ternary data string coincides with any one of the binary numbers,
- calculate a total number of bits that cannot be converted into the binary data string as a number of pieces of the unprocessed data, and
- calculate a second valid range value of bits of the binary data string obtained by subtracting the number of pieces of the unprocessed data from the first valid range value;

a binary data storing unit configured to store the binary data string, the second valid range value, and the number of pieces of the unprocessed data; and an f value retention processing unit configured to
- read the binary data string, the second valid range value, and the number of pieces of the unprocessed data from the binary data storing unit,
- output no coded bit string for the target bit, and add the number of pieces of the unprocessed data thus read to the number of pieces of the unprocessed data held in advance, when the second valid range value is zero,
- determine whether or not the number of pieces of the unprocessed data is held in advance when the second valid range value is more than zero,
- output an coded bit string in which an inverted value of an initial bit of the binary data string is inserted next to the initial bit by the number equivalent to the number of pieces of the unprocessed data held in advance, and overwrite the read number of pieces of the unprocessed data onto the number of pieces of the unprocessed data held in advance, when the number of pieces of the unprocessed data has been held; and
- output the binary data string as an coded bit string, and hold the number of pieces of the unprocessed data thus read, when the number of pieces of the unprocessed data has not been held.

2. The binary arithmetic coding device according to claim 1 wherein
when the target bit coincides with the more probable symbol, the binary arithmetic re-normalization unit determines the range width of less probability as the temporary range width of less probability, and determines a value obtained by subtracting the symbol ratio from the coding range width as the temporary coding range width; and
when the target bit does not coincide with the more probable symbol, the binary arithmetic re-normalization unit determines a value obtained by adding the value obtaining by subtracting the symbol ratio from the range width of less probability to the coding range width as the temporary range width of less probability, and determines the symbol ratio as the temporary coding range width.

3. The binary arithmetic coding device according to claim 1 wherein in the bit output processing,
when the temporary range width of less probability is less than ¼ of a maximum coding range width determined by the binary arithmetic coding, one of the binary numbers is outputted as a bit, and the temporary range width of less probability is shifted to the left by 1 bit;
when the temporary range width of less probability is not less than ¼ of the maximum coding range width determined by the binary arithmetic coding, the temporary range width of less probability is compared with ½ of the maximum coding range width determined by binary arithmetic coding;
when the temporary range width of less probability is not less than ½ of the maximum coding range width determined by the binary arithmetic coding, the other of the binary numbers is outputted as a bit, and a value obtained by subtracting ½ of the maximum value of the coding range width determined by the binary arithmetic coding from the temporary range width of less probability is shifted to the left by 1 bit; and
when the temporary range width of less probability is less than ½ of the maximum coding range width determined by the binary arithmetic coding, the uncertain value is outputted as a bit, and a value obtained by subtracting ¼ of the maximum value of the coding range width determined by the binary arithmetic coding from the temporary range width of less probability is shifted to the left by 1 bit.

4. The binary arithmetic coding device according to claim 1, wherein
when the constant number of times is n times, the binary arithmetic re-normalization unit performs first comparison of a value obtained by shifting the temporary coding range width to the left by n−1 bits with ¼ of the maximum coding range width determined by binary arithmetic coding, and when the value obtained by shifting the temporary coding range width to the left by the n−1 bit is less than ¼ of the maximum coding range width determined by binary arithmetic coding, the binary arithmetic re-normalization unit outputs the first valid range value indicating that a bit range from an initial bit to an n-th bit of the ternary data string are valid;
when the value obtained by shifting the temporary coding range width to the left by n−1 bits is not less than ¼ of the maximum coding range width determined by binary arithmetic coding, the binary arithmetic re-normalization unit performs second comparison of a value obtained by further shifting to the left by 1 bit the value obtained by shifting the temporary coding range width to the left in the previous comparison, with ¼ of the maximum coding range width determined by binary arithmetic coding, and when the value further shifted to the left by 1 bit is less than ¼ of the maximum coding range width determined by the binary arithmetic coding, the binary arithmetic re-normalization unit performs an output processing to output, from an initial bit of the ternary data string, a bit range with 1 bit less than bits in the bit range obtained by the previous output processing as the first valid range value; and
when the value further shifted to the left by 1 bit is not less than ¼ of the maximum coding range width determined by the binary arithmetic coding, the binary arithmetic re-normalization unit repeats the second comparison and the output processing until the number of left shifting the temporary coding range width becomes zero, when the temporary coding range width is less than ¼ of the maximum range width determined by binary arithmetic coding, the binary arithmetic re-normalization unit outputs the first valid range value indicating that the initial bit of the ternary data string is valid, and when the temporary coding range width is not less than ¼ of the maximum range width determined by the binary arithmetic coding, the binary arithmetic re-normalization unit outputs the first valid range value indicating that all the bits of the ternary data string are invalid.

5. The binary arithmetic coding device according to claim 4 wherein
the binary arithmetic re-normalization unit
outputs the first valid range value by the output processing,
outputs as an updated coding range width a value obtained by shifting the temporary coding range width to the left by a number of times of the left shifting in the previous comparison;
outputs the temporary range width of less probability updated by an n-th bit output processing as an updated range width of less probability, where n is equivalent to the number of left shifting in the previous comparison; and
uses the updated coding range width and the updated range width of less probability for coding of a bit to be coded subsequent to the target bit.

6. The binary arithmetic coding device according to claim 1 wherein
the binary conversion unit performs a conversion processing in which
the binary conversion unit performs first comparison of whether or not an s-th bit of bits of the ternary data string coincides with one of the binary numbers; when the s-th bit coincides with one of the binary numbers, the binary conversion unit performs first determination of whether or not the (s−1)-th bit coincides with one of the binary numbers; when the (s−1)-th bit coincides with one of the binary numbers, the binary conversion unit determines the s-th bit as the s-th bit of the binary data string; and when the (s−1)-th bit coincides with neither of the binary numbers, the binary conversion unit determines an inverted value of the s-th bit as the s-th bit of the binary data string; and
when the s-th bit coincides with neither of the binary numbers, the binary conversion unit performs second comparison of whether or not the next bit used in the previous comparison coincides with one of the binary numbers; when the next bit coincides with one of the binary numbers, the binary conversion unit performs the first determination; when the (s−1)-th bit coincides with one of the binary numbers, the binary conversion unit determines the next bit as the s-th bit of the binary data string; and when the (s−1)-th bit coincides with neither of the binary numbers, the binary conversion unit determines an inverted value of the next bit as the s-th bit of the binary data string; and
when the next bit coincides with neither of the binary numbers, the binary conversion unit repeats the second comparison, the first determination, and the conversion processing until a last bit of the ternary data string; and when the last bit coincides with neither of the binary numbers, the binary conversion unit determines the s-th bit of the binary data string as invalid and does not output the s-th bit.

7. The binary arithmetic coding device according to claim 1 wherein the maximum coding range width determined by the binary arithmetic coding is a maximum value of an coding range width specified by H.264.

* * * * *